United States Patent [19]

Seon

[11] Patent Number: 5,792,324
[45] Date of Patent: Aug. 11, 1998

[54] METHOD AND APPARATUS OF FORMING A THIN FILM

[75] Inventor: Jeong-Min Seon, Jeonlanam-do, Rep. of Korea

[73] Assignee: LG Semicon Co., Ltd., Chungcheongbuk-do, Rep. of Korea

[21] Appl. No.: 678,698

[22] Filed: Jul. 11, 1996

[30] Foreign Application Priority Data

Apr. 12, 1996 [KR] Rep. of Korea .................. 11067

[51] Int. Cl.$^6$ .................................................. C23C 14/34
[52] U.S. Cl. .................. 204/192.15; 204/192.12; 204/192.16; 204/192.17; 204/192.18; 204/192.26; 204/298.07
[58] Field of Search .................... 204/192.12, 192.15, 204/192.17, 192.18, 192.26, 192.16, 298.07, 192.3

[56] References Cited

U.S. PATENT DOCUMENTS

| 5,415,756 | 5/1995 | Wolfe et al. | 204/192.23 |
| 5,614,070 | 3/1997 | Moon | 204/298.07 |

FOREIGN PATENT DOCUMENTS

| 5-109655 | 4/1993 | Japan | 204/298.07 |

*Primary Examiner*—Aaron Weisstuch

[57] ABSTRACT

A method of forming a thin film using a sputtering apparatus having a chamber, includes the steps of providing a target and a wafer in the chamber, and providing an inert gas to form atomized target material, a reactive etching gas for reacting with the target to form a molecular by-product, and a reactive sputter gas for reacting with the atomized target material and the molecular by-product to form a thin film on the wafer.

20 Claims, 1 Drawing Sheet

○ (a target of on atomic state)
● (a by-product of a melecular state)
⊗ (reactive sputter gas+a target of on atomic state)
  (reactive sputter gas+a by-product of a molecular state)

○ (a target of on atomic state)
● (a by-product of a melecular state)
⊗ (reactive sputter gas+a target of an atomic state)
  (reactive sputter gas+a by-product of a molecular state)

METHOD AND APPARATUS OF FORMING A THIN FILM

BACKGROUND OF THE INVENTION

The present invention relates to a method of forming a thin film, and more particularly, to a reactive sputtering deposition method for depositing a thin film at a high temperature.

Generally, sputtering is used for depositing a metal thin film and an insulating layer on a wafer. In sputtering, gas ions having a high energy in a plasma which is formed with the use of about 100 to 500V of RF voltage or DC voltage collide with a target surface to emit target particles, thereby depositing the target particles on a substrate. That is, a target material to be deposited is mounted on a cathode in a sputtering apparatus, and the emitted target material is deposited on a substrate placed on an anode of the sputtering apparatus using a plasma of an inert gas such as a helium (He) and argon (Ar). These inert gases do not affect the characteristics of the depositing material.

There are generally three conventional methods of sputtering. The first method includes diode DC sputtering and diode RF sputtering. In a system using this method, a target is connected to a negative potential, and an anode in a chamber is connected to a positive potential. If the target of negative charge generates electrons, the generated electrons collide with Ar gas to be ionized while the electrons are accelerated to the anode. Then, the Ar atoms ionized into positive charges are accelerated to the target, thereby causing sputtering thereof. Here, since the ionized Ar atoms and target form a diode, this method is called diode sputtering.

The second method is known as triode sputtering. A system for this method has a separate high-current filament to emit electrons which are required to ionize gases. This method can be used in a low vacuum.

The third method is called magnetron sputtering. In this method, roving electrons which do not contribute to ionized plasma discharge, are trapped by a magnetic field placed behind or on the side of the target and they move around the target. Accordingly, ion current generated by a flux caused by the collision of the ionized Ar atoms with the target, is high so that a faster deposition is possible in this method.

However, the conventional sputtering methods have the following problems. First, if Ar ions having a large momentum collide with a target material having a low conductivity and no ductility, e.g., a ceramic, mechanical or electrostatic stress is generated on the target surface, producing particles. Secondly, in the sputtering during which a large bias voltage is applied, negative ions of a reactive gas resputter the substrate, so that the composition of a deposited layer may be changed. Thirdly, in the case where a reactive sputtering of a metal target is performed, sputtered metal atoms are dispersed due to a cosine distribution at the target face, resulting in a poor step coverage by the deposited layer.

SUMMARY OF THE INVENTION

It is an object of the present invention to provide a method of forming a thin film having a good step coverage.

It is another object of the present invention to provide a method of forming a thin film capable of reducing the sputtering bias voltage.

It is still another object of the present invention to provide a method of forming a thin film capable of decreasing mechanical and electrostatic stresses applied to the surface of a target.

It is yet another object of the present invention to provide a method of forming a thin film capable of reducing the resputtering effect which affects the substrate due to a reactive gas.

To accomplish these objects of the present invention, there is provided a method of forming a thin film using a sputtering apparatus having a chamber, including the steps of placing a target and a wafer into a chamber, providing an inert gas which reacts with the target to atomize the target material, providing a reactive etching gas which reacts with the target to form a molecular by-product, and providing a reactive sputter gas which reacts with the atomized target and the molecular by-product to form a thin film on the wafer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a method of forming a thin film using a sputtering apparatus having a chamber, including the steps of providing a target and a wafer in the chamber, and providing an inert gas to form an atomized target material, a reactive etching gas for reacting with the target to form a molecular by-product, and a reactive sputter gas for reacting with the atomized target material and the molecular by-product so to form a thin film on the wafer.

Furthermore, the present invention is directed to a sputtering apparatus for forming a thin film, including a chamber having a plurality of inlets for inputting gas into the chamber and a plurality of outlets for outputting gas from the chamber, the chamber having a first area for placing a target and a second area for placing a wafer, the plurality of inlets including a first inlet for providing an inert gas, a second inlet for providing a reactive etching gas, and third and fourth inlets for providing a reactive sputter gas, so as to form a thin film on the wafer. The sputtering apparatus further has the target connected to a power supply and placed at an upper portion of the chamber, and a susceptor for mounting the wafer thereon placed at a lower portion of the chamber.

BRIEF DESCRIPTION OF THE ATTACHED DRAWINGS

The novel features believed characteristic of the invention, as well as other features and advantages thereof, will best be understood by reference to the following detailed description of embodiments, read in conjunction with the accompanying drawings, wherein:

FIG. 1 shows a formation of a thin film in a sputtering apparatus having a chamber according to the embodiments of the present invention.

DETAILED DESCRIPTION OF PREFERRED EMBODIMENTS

Figure 1:
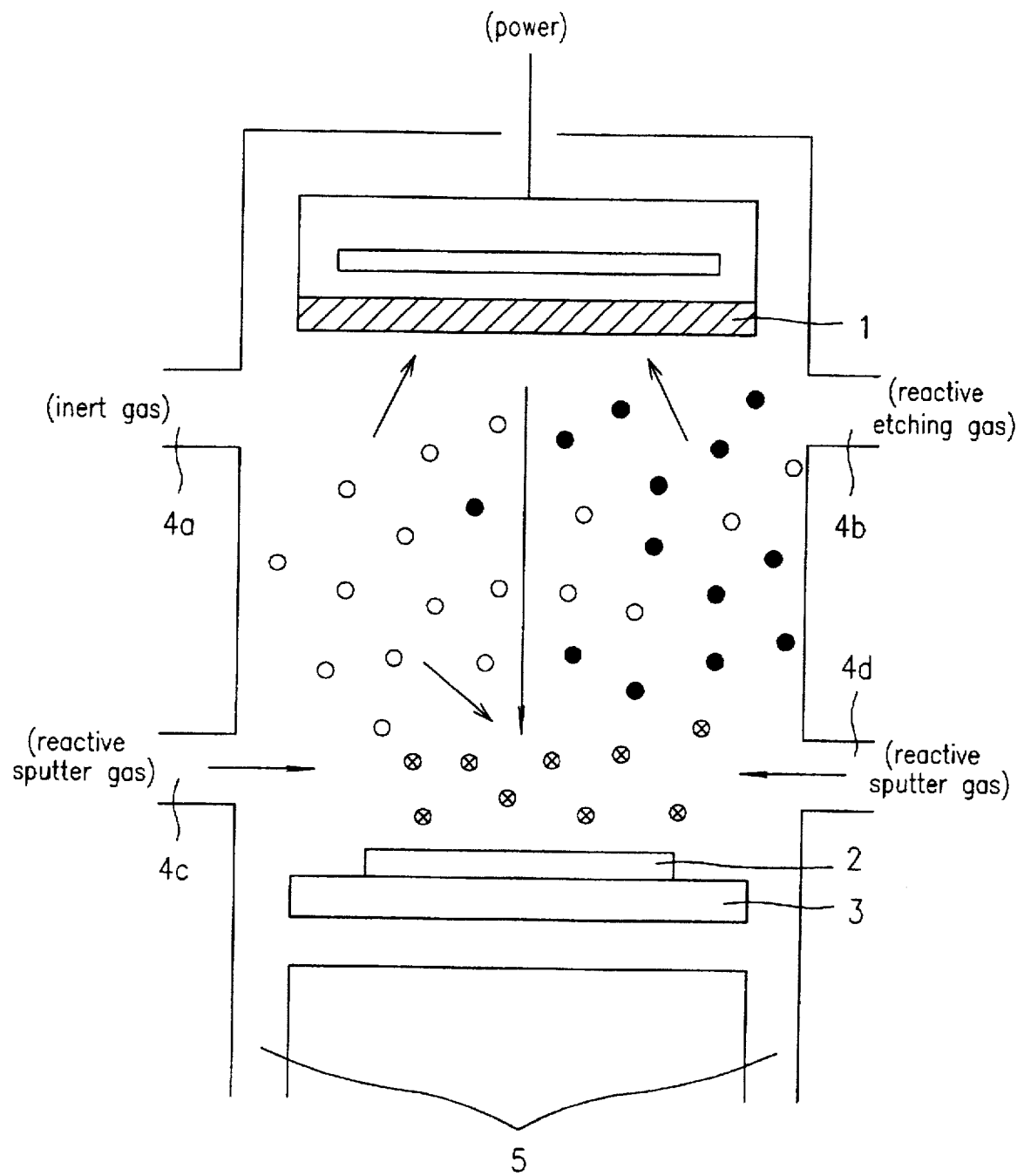

A preferred embodiment of the present invention will be explained below with reference to the accompanying drawing.

As shown in FIG. 1, the chamber of the sputtering apparatus according to the embodiments of the present invention includes a target 1 connected to a power supply, a susceptor 3 for mounting a wafer 2 thereon during a high-temperature process, and inlet ports 4a, 4b, 4c, and 4d and exhaust port 5 for inletting and exhausting gases for depositing a thin film. Here, the target material is made of either a ceramic or a metal. For a ceramic, one of BSTO ((Ba,Sr)TiO$_3$) (barium strontium titanium oxide), STO (SrTiO$_3$) (strontium titanium oxide), PLZT (PbLiZrTiO$_3$) (lead lithium zirconium titanium oxide), LSCO (LiSrCuO$_4$) (lithium strontium copper oxide), YBCO (yttrium barium copper oxide) and Y$_1$ (SrBiTaO$_9$) (strontium bismuth tantalum oxide), for example, is used as the target material, and for a metal, one of Ti, Ta, W and Al, for example, is used.

A process of forming a thin film on a wafer in the above-described chamber of the sputtering apparatus according to the embodiments of the present invention will be explained below.

First of all, the wafer 2 is cleaned before being loaded into the chamber in which the target 1 is also installed. This is because a clean wafer is required to successfully deposit a material thereon. Then, the wafer 2 is mounted on the susceptor 3, and the chamber is evacuated. Gases are flowed into inlet ports 4a, 4b, 4c, and 4d, and the wafer 2 is heated in order to deposit a thin film thereon.

At this time, an inert gas is injected into the inlet port 4a for reacting with the target 1, thereby atomizing the target 1, and a reactive etching gas is injected into the inlet port 4b to react with the target 1, thereby forming a molecular by-product. A reactive sputter gas is injected into the inlet ports 4c and 4d to react with the atomized target 1 and the molecular by-product, thereby forming a thin film on the wafer 2. Here, for the reactive etching gas, one of HBr and Cl$_2$, for example, is used, and for the inert gas, Ar is used, for example.

The reactive sputter gas may be, e.g., one of O$_2$ and N$_2$. The heated wafer 2 provides the reactive sputter gas with an activation energy. The inert gas, Ar, which does not affect the characteristics of the depositing material, collides with the surface of the target 1, to thereby emit atomized target material to be deposited. The reactive etching gas reacts with the target material, thereby forming a molecular target material. The atomized target material and the molecular target material react with the reactive sputter gas on the wafer 2 to form a stable thin film on the wafer 2.

Here, the activation energy of the reactive sputter gas is larger than that of the reactive etching gas. That is, the atomized target material emitted by Ar ion bombardment reacts with the reactive sputter gas so as to be sputter-deposited on the wafer 2, and the molecular target material emitted by the reactive etching gas reacts with the reactive sputter gas to be deposited as a thin film on the wafer 2, as in a chemical vapor deposition (CVD) process. When a desired thickness of the thin film is deposited on the wafer 2, gases are discharged through the exhaust port 5. Then the wafer 2 is unloaded from the chamber.

In the process of forming a thin film on a wafer according to the embodiments of the present invention, the reactive etching gas must be properly selected according to the target material and reactive sputter gas. For example, in the case where the target material is Ti, NH$_3$ and H$_2$ are injected as reactive sputter gases and Cl$_2$ is injected as a reactive etching gas. Then, according to the following reaction formula:

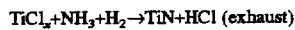

TiCl$_x$+NH$_3$+H$_2$→TiN+HCl (exhaust)

TiN is deposited on the wafer. In the case where the target material is composed of a ceramic material, one of HBr and Cl$_2$ is used for the reactive etching gas, and for the reactive sputter gas, one of O$_2$ and N$_2$ is used. Here, for a ceramic target material, one of BSTO ((Ba,Sr)TiO$_3$) (barium strontium titanium oxide), STO (SrTiO$_3$) (strontium titanium oxide), PLZT (PbLiZrTiO$_3$) (lead lithium zirconium titanium oxide), LSCO (LiSrCuO$_4$) (lithium strontium copper oxide), YBCO (yttrium barium copper oxide) and Y$_1$ (SrBiTaO$_9$) (strontium bismuth tantalum oxide) is used. The reactive etching gas reacts with the target material and reactive sputter gas, thereby acquiring an effect which can be obtained using a CVD process.

As described above, the method of forming a thin film according to the present invention has the following advantages. First, a thin film is formed through reactive sputtering deposition to which CVD is added so that the surface mobility of the thin film is increased and the step coverage of the film is improved. Secondly, since the target material is emitted from the target using sputtering by Ar together with the reactive etching gas, the sputtering bias voltage can be reduced and the sputtering rate is increased. Thirdly, in case a ceramic is used as a target, it is possible to decrease the mechanical and electrostatic stresses applied to the surface of the ceramic target having no ductility with respect to Ar bombardment. Thus, the particle characteristics affected by the mechanical and electrostatic stresses are improved. Fourthly, the resputtering effect, in which negative ions of the reactive sputter gas resputter a substrate, can be reduced.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method of forming a thin film using a sputtering apparatus having a chamber, the method comprising the steps of:

providing a target and a wafer in the chamber; and providing an inert gas plasma for sputtering the target to form atomized target material, a reactive etching gas to react with said target to form a molecular by-product, and a reactive sputter gas for reacting with the atomized target material and the molecular by-product so to form a thin film on the wafer.

2. A method as claimed in claim 1, wherein the reactive etching gas is one of HBr and Cl$_2$.

3. A method as claimed in claim 1, wherein the inert gas is Ar.

4. A method as claimed in claim 1, wherein the reactive sputter gas is one of O$_2$ and N$_2$.

5. A method as claimed in claim 1, wherein the target is composed of one of a ceramic material and a metal.

6. A method as claimed in claim 5, wherein the ceramic material includes one of BSTO ((Ba,Sr)TiO$_3$) (barium strontium titanium oxide), STO ((SrTiO$_3$) (strontium titanium oxide), PLZT (PbLiZrTiO$_3$) (lead lithium zirconium titanium oxide), LSCO (LiSrCuO$_4$) (lithium strontium copper oxide), YBCO (yttrium barium copper oxide), and Y$_1$ (SrBiTaO$_9$) (strontium bismuth tantalum oxide).

7. A method as claimed in claim 5, wherein the metal is one of Ti, Ta, W, and Al.

8. A method as claimed in claim 1, wherein the activation energy of the reactive sputter gas is greater than that of the reactive etching gas.

9. A method as claimed in claim 1, wherein the step of providing the inert gas includes the steps of:

bombarding the target with the inert gas plasma, and forming the atomized target material by the bombarding.

10. A method as claimed in claim 9, wherein the step of providing the reactive etching gas includes the steps of:

reacting the reactive etching gas with the atomized target material, and forming the molecular by-product by the reaction.

11. A method as claimed in claim 10, wherein the step of providing the reactive sputter gas includes the steps of:

reacting the reactive sputter gas with the atomized target material and the molecular by-product, and forming the thin film by the reaction.

12. A method as claimed in claim 1, wherein the step of providing the reactive sputter gas includes the steps of:

reacting the reactive sputter gas with the atomized target material, and forming the molecular by-product, and by the reaction.

13. A method as claimed in claim 1, wherein the step of providing the reactive etching gas includes the steps of:

reacting the reactive etching gas with the atomized target material, and the molecular by-product, and forming the thin film by the reaction.

14. A sputtering apparatus for forming a thin film, comprising:

a chamber having a plurality of inlets for inputting gas into the chamber and a plurality of outlets for outputting gas from the chamber, the chamber having a first area for placing a target and a second area for placing a wafer, the plurality of inlets including a first inlet for providing an inert gas, a second inlet for providing a reactive etching gas, and third and fourth inlets for providing a reactive sputter gas, so to form a thin film on the wafer;

the target connected to a power supply and placed at an upper portion of the chamber; and a susceptor for mounting the wafer thereon, the wafer being placed at a lower portion of the chamber.

15. An apparatus as claimed in claim 14, wherein the reactive etching gas is one of HBr and $Cl_2$.

16. An apparatus as claimed in claim 14, wherein the reactive sputter gas is one of $O_2$ and $N_2$.

17. An apparatus as claimed in claim 14, wherein the target is composed of one of BSTO (($Ba,Sr)TiO_3$) (barium strontium titanium oxide, STO(($SrTiO_3$) (strontium titanium oxide), PLZT ($PbLiZrTiO_3$) (lead lithium zirconium titanium oxide), LSCO ($LiSrCuO_4$) (lithium strontium copper oxide), YBCO (yttrium barium copper oxide), and $Y_1$, ($SrBiTaO_9$) (strontium bismuth tantalum oxide).

18. An apparatus as claimed in claim 14, wherein the target is composed of one of Ti, Ta, W, and Al.

19. An apparatus as claimed in claim 14, wherein the activation energy of the reactive sputter gas is greater than that of the reactive etching gas.

20. An apparatus as claimed in claim 14, wherein the first inlet receives the inert gas for forming a plasma to bombard the target so to form atomized target material within the chamber, the second inlet receives the reactive etching gas for reacting with the target to form a molecular by-product within the chamber, and the third and fourth inlets receive the reactive sputter gas for reacting with the atomized target material and the molecular by-product to form the thin film on the wafer.

* * * * *